United States Patent [19]

Koepke et al.

[11] Patent Number: 4,991,291
[45] Date of Patent: Feb. 12, 1991

[54] METHOD FOR FABRICATING A FOLD-UP FRAME

[75] Inventors: Richard A. Koepke, New Bedford, Mass.; George O. Koepke, Rochester, N.Y.

[73] Assignee: Isotronics, Inc., New Bedford, Mass.

[21] Appl. No.: 458,959

[22] Filed: Dec. 29, 1989

[51] Int. Cl.⁵ ............................................. H01R 43/16
[52] U.S. Cl. ........................................ 29/884; 29/412; 174/52.5; 174/52.4; 361/429; 228/142; 228/152; 228/179
[58] Field of Search ................. 29/412, 462, 882, 884; 174/52.4, 52.5; 361/390, 419, 429; 53/456; 228/142, 152, 179

[56] References Cited

U.S. PATENT DOCUMENTS

| | | | |
|---|---|---|---|
| 3,427,715 | 2/1969 | Mika | 361/398 |
| 3,899,720 | 8/1975 | Peterson | 317/101 |
| 3,967,772 | 7/1976 | Baker | 53/456 |
| 4,007,479 | 2/1977 | Kowalski | 174/52.4 |
| 4,076,955 | 2/1978 | Gates, Jr. | 174/52 |
| 4,167,647 | 9/1979 | Salera | 174/52 |
| 4,176,447 | 12/1979 | Brennan | 264/257 |
| 4,412,093 | 10/1983 | Wildeboer | 174/52 |
| 4,480,148 | 11/1984 | Archer | 174/51 |
| 4,506,108 | 3/1985 | Kersch et al. | 174/52 |
| 4,542,259 | 9/1985 | Butt | 174/52 |
| 4,633,573 | 1/1987 | Scherer | 174/52 |
| 4,649,229 | 3/1987 | Scherer et al. | 174/52 |

FOREIGN PATENT DOCUMENTS 1169542 5/1964 Fed. Rep. of Germany ........ 29/882
112690 7/1983 Japan .................................. 228/142

Primary Examiner—P. W. Echols
Attorney, Agent, or Firm—Weingarten, Schurgin, Gagnebin & Hayes

[57] ABSTRACT

A method is disclosed for easy and inexpensive fabrication of fold-up frames having diverse geometric configurations for flat packs (metal packages) for housing discrete and integrated circuit chips. The method includes a first step of cutting a piece of flat metallic stock to predetermined length and width consistent with the number of fold-up frames and the perimeter required for the specific fold-up frame configuration to be fabricated, respectively. The flat stock is then milled to form a plurality of grooves of predetermined angle lengthwise in at least one major surface thereof to define the number of sidewall members in the final configuration of the fold-up frame. The milled flat stock may then be sliced to form a plurality of individual milled frames each having the predetermined height required by the specific configuration fold-up frame. Apertures are formed in the milled frame by punching or piercing all sidewall members simultaneously in a single operation. In a variation of the above-described method, the apertures are simultaneously punched in the milled flat stock prior to slicing thereof. The apertured, milled frame is then folded along the respective grooves to form the final specific configuration of the fold-up frame. The free ends of the milled frame in abutting engagement are secured together to fix the fold-up frame in the final specific configuration.

10 Claims, 4 Drawing Sheets

METHOD FOR FABRICATING A FOLD-UP FRAME

FIELD OF THE INVENTION

This invention relates generally to flat packs for housing hybrid and semiconductor discrete and integrated circuit chips, and more particularly to a method for inexpensively forming fold-up frames having a wide variety of geometric configurations

BACKGROUND OF THE INVENTION

Hybrid metal packages, i.e., flat packs, have been used for many years to hermetically house hybrid and semiconductor discrete and integrated circuit chips. The basic flat pack comprises a square or rectangular frame having lead apertures formed therethrough and a bottom affixed to the frame. One or more chips are internally mounted to the bottom of the package and electrically connected to external circuitry by means of conductive leads or pins passing through the apertures in the frame. To ensure hermetic sealing and to preclude short circuiting between the leads and the frame, the leads are fitted within an insulative bead such as glass and the bead-lead combination is sealed in the apertures of the frame.

The traditional method of manufacturing frames for flat packs has required several tooling steps and multiple handling of the frame as it is being fabricated. The basic frame configuration is formed by coining or extrusion operations from metallic tubular stock. The coined or extruded frame is then subjected to a grinding operation to grind the frame to a predetermined height A deburring step is required subsequent to the grinding step to smooth the edges of the frame. One or more tooling steps are then required to punch the apertures in the sidewall members of the frame. Each of the four sides of the frame are punched independently, and if the aperture pattern in the various sidewall members is different, the aperture pattern for each side requires a separate set-up. The frame is then chemically processed and a bottom brazed thereto.

Lead frames for each frame sidewall are cut from strip stock and the individual conductive leads of each frame manually fitted with an insulative bead. The beaded lead frame is then disposed in combination with the corresponding frame sidewall by sliding the beads into corresponding apertures thereof. The frame assembly is mounted on specially designed carbon fixtures and fired in a furnace to seal the beaded leads within the apertures of the frame sidewall.

The above-described traditional method of forming frames for flat packs has several inherent disadvantages. Because the initial frame configuration is formed by coining or extrusion, the shape of the frame is limited to square, rectangular and/or circular configurations. Expensive, specialized tooling and lengthy lead times are required to produce flat packs having nontraditional sizes and shapes. A large inventory of tubular stock of various sizes must generally be maintained to ensure that proper stock is available. Moreover, the traditional methods of manufacturing frames requires numerous handling of the frames during the fabrication process which increases the overall expense of the finished frames and increases the possibility of damage to the frames during the fabrication process. In addition, flat pack frames formed by traditional methods limit the inside pin extensions of the conductive leads due to internal space restrictions and/or aperture sizing.

SUMMARY OF THE INVENTION

A method of fabricating fold-up frames for flat packs is disclosed wherein basic frames of diverse geometric configuration may be readily formed without coining or extrusion or the need for specialized tooling or costly fixturing. Fold-up frames according to the present invention are readily suited for automated fabrication techniques, thereby eliminating the attendant disadvantages of manual and/or frequent handling.

The fold-up frame fabricated by means of the method of the present invention is not restricted to rectangular, square or circular configurations, but may be used to fabricate a variety of regular or irregular polygonal or specially-shaped configurations thereby providing a wide latitude in design alternatives. Fold-up frames according to the present invention permit the utilization of a wide variety of lead configurations, thereby providing greater range in shape, construction and performance capabilities.

Fold-up frames fabricated according to the present method have particular utility in fabricating custom-tailored flat packs having minimum space requirements. By means of the method of the instant invention, a single piece of flat metallic stock may be utilized to produce a large variety of fold-up frames for flat packs. The use of flat metallic stock enables the manufacturer to significantly reduce the amount of inventory necessary for the fabrication of frames. The disclosed method of fabricating flat pack frames also reduces material losses due to process changes.

For a predetermined fold-up frame configuration, the flat stock is first cut to a predetermined length and width consistent with the number of fold-up frames and the perimeter required for the specific fold-up frame configuration to be fabricated, respectively. The flat stock is then milled to form a plurality of grooves of predetermined angle lengthwise in at least one major surface thereof to define the number of sidewall members in the final configuration of the fold-up frame. The opposed free edges of the flat stock are milled to have congruent angled faces of one-half the predetermined angle of the grooves.

The milled flat stock may then be sliced to form a plurality of individual milled frames. The slicing operation is effected to ensure that each individual milled frame has the predetermined height required by the final configuration of the fold-up frame, and the slicing operation eliminates the need for subsequent grinding of the individual fold-up frames Apertures may then be formed in individual milled frames by punching or piercing all sidewall members simultaneously in a single operation.

In a variation of the method of the present invention, apertures may be formed in the sidewall members of the milled flat stock. The apertured flat stock may be sliced to form individual milled frames having the predetermined height required by the final configuration of the fold-up frame.

Each apertured, milled frame is then folded or bent along the grooves thereof to bring the respective faces of each groove into abutting engagement. Folding causes the congruent angled faces of the free edges of the milled frame to be sequentially displaced through the predetermined angles into abutting engagement with each other. For apertured, milled frames having grooves formed in both major surfaces thereof, the frame sidewalls may be folded both inwardly and outwardly to form fold up frames having specialized configurations.

The folding step transforms the apertured, milled frame into the final configuration of the fold-up frame. The final configuration of the fold-up frame is fixed by securing the congruent angled faces together, for example by brazing.

Conductive leads having insulative beads or preforms fitted thereon may be secured in combination with the apertured, milled frame prior to the folding operation. Alternatively, the beaded leads may be secured in combination with the fold-up frame in final configuration.

BRIEF DESCRIPTION OF THE DRAWINGS

A more complete understanding of the present invention and the attendant advantages and features thereof will be more readily understood by reference to the following detailed description when considered in conjunction with the accompanying drawings wherein.

DETAILED DESCRIPTION OF PREFERRED EMBODIMENTS

Figure 1A:
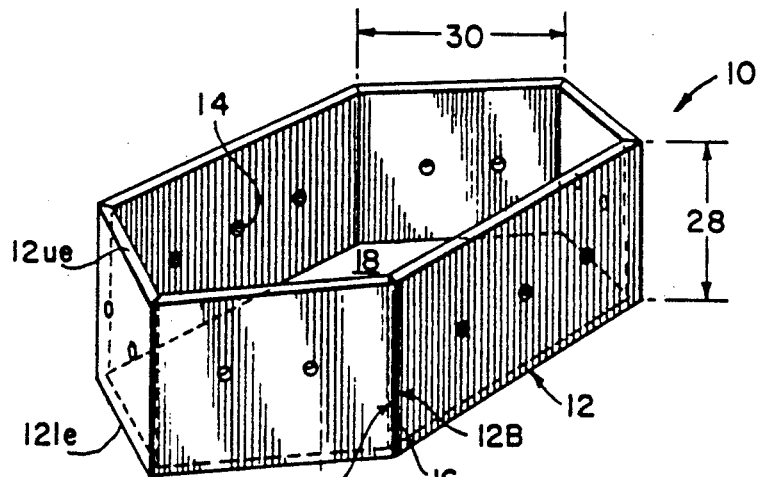
FIG. 1A is a perspective view of one exemplary embodiment of a fold-up frame fabricated according to the method of the present invention.
Figure 1B:
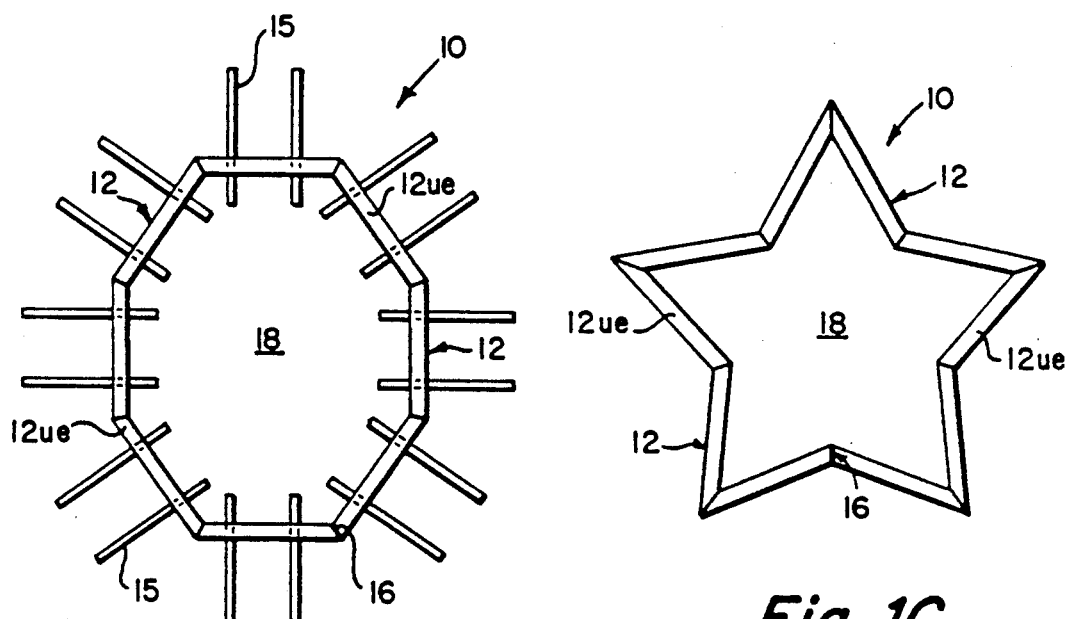
FIG. 1B is a plan view of another exemplary embodiment of a fold-up frame fabricated according to the method of the present invention, illustrating conductive leads disposed in combination therewith.
Figure 1C:
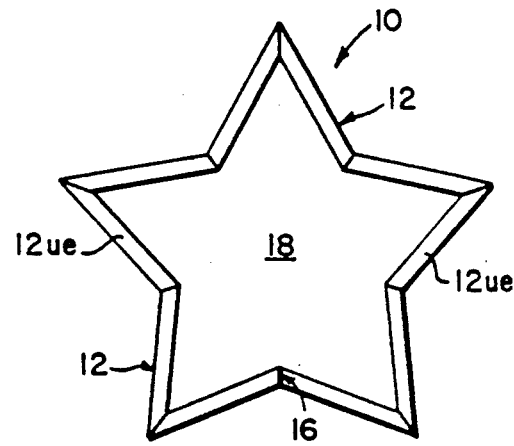
FIG. 1C is a plan view of yet another exemplary embodiment of a fold-up frame fabricated according to the method of the present invention.

Referring now to the drawings wherein like reference numerals designate corresponding or similar elements throughout the several views, FIGS. 1A, 1B, 1C illustrate exemplary embodiments of fold-up frames 10 fabricated according to the method of the present invention that have utility in fabrication of a flat pack (not shown). The fold-up frame 10 comprises a plurality of sidewall members 12 having apertures 14 formed therethrough into which conductive leads 15 (see FIGS. 1B, 6) are disposed. The free ends 12A, 12B (see FIGS. 5, 6) of opposite sidewall members 12 are secured together, for example by a braze joint 16, to fix the fold-up frame 10 in final configuration. The final configuration of the fold-up frame 10 defines an internal volume 18 for mounting one or more ICs.

To form the flat pack, a bottom 13 (see FIG. 5) is secured, for example by brazing, to edges $12_{lc}$ of the sidewall members 12. One or more ICs may be mounted to the bottom 13 of the flat pack within the internal volume 18 thereof defined by the sidewalls 12 of the fold-up frame 10. The conductive leads 15, having insulative beads or preforms 17 fitted therearound, may be simultaneously inserted in the apertures 14. The assembled flat pack may then be heated in a carbon sealing fixture to seal the leaded preforms 17 in the apertures 14 of the sidewall members 12. After wire bonding of the ICs to the lead ends extending into the internal volume 18, a cover (not shown) may be secured to the edges $12_{ue}$ of the sidewall members 12 to form a sealed flat pack.

The number of sidewall members 12 and the number of apertures 14 formed in each sidewall member 12 depends upon, inter alia, the configuration of the integrated circuit or circuits disposed within the flat pack and the particular application for the flat package. As exemplarily illustrated in drawings, the final configuration of the fold-up frame 10 may be, for example, hexagonal (FIG. 1A), octagonal (FIG. 1B), or star-shaped (FIG. 1C). As will be discussed hereinbelow in greater detail, the method of fabricating a fold-up frame according to the present invention has particular utility in easily and inexpensively fabricating frames of diverse geometric configurations. In addition to conventional square and rectangular configurations, the method of the present invention permits the fabrication of a wide variety of fold-up frames having regular (sidewall members having equal lengths) and irregular (sidewall members having different lengths) configurations. The method of the present invention has particular utility in the fabrication of fold-up frames, and in consequence flat packs, that may be tailored for specific operating environments utilizing a minimum of space.

Figure 2:
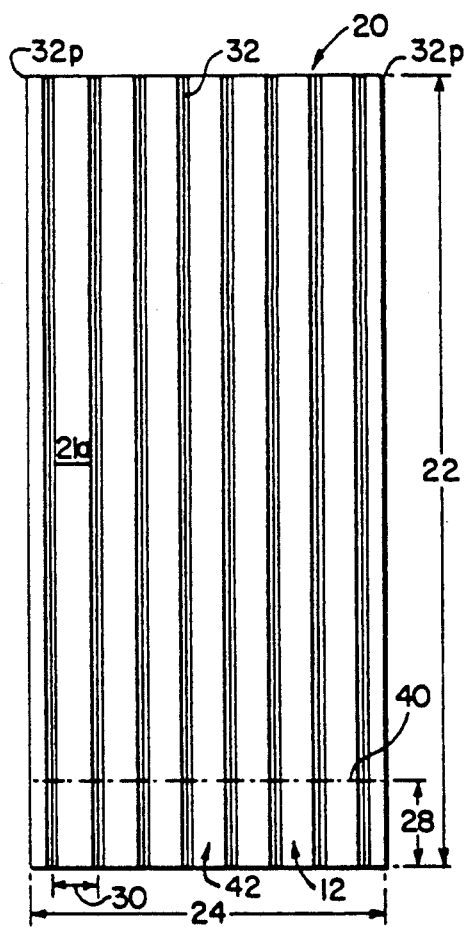
FIG. 2 is a plan view illustrating flat stock partially processed on one major surface thereof according to the method of the present invention.
Figure 3A:
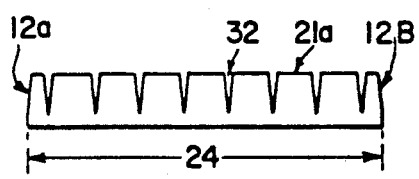
FIG. 3A, is an end view of the partially processed flat stock of FIG. 2.
Figure 3B:
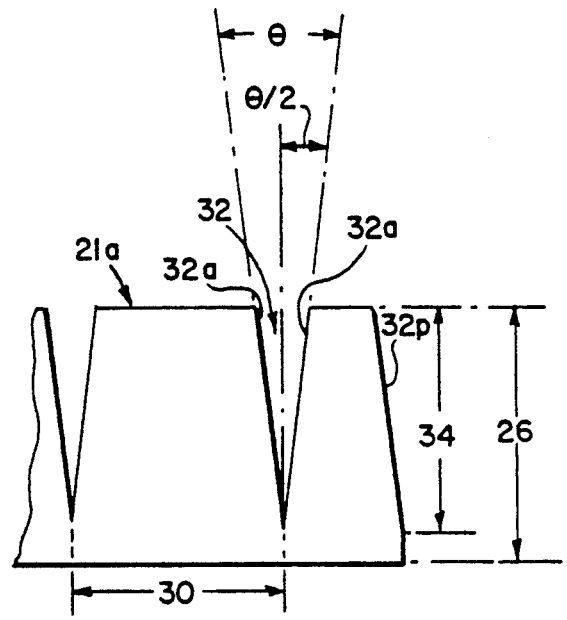
FIG. 3B is an enlarged partial view of FIG. 3A.

The first step in fabricating a fold-up frame 10 according to the method of the present invention involves selecting a flat piece of conductive metallic stock 20 as shown in FIG. 2. One metallic material having utility in the fabrication of fold-up frames is an ASTM F15 alloy such as Kovar, a metallic alloy of about 54% iron, about 29% nickel and about 17% cobalt. The flat stock 20 has predetermined overall dimensions of length 22, width 24 and thickness 26 (FIG. 3B).

The predetermined overall length 22 of the flat stock 20 is based upon the number of fold-up frames 10 to be fabricated from the flat stock 20 and the height 28 (see FIG. 1A) of the sidewall members 12 required for each fold-up frame 10. The predetermined overall width 24 of the flat stock 20 is based upon the number of sidewall members 12 required by the final configuration of the fold-up frame 10 and the respective lengths 30 (see FIGS. 1A, 3B) of each sidewall member 12. The overall thickness 26 of the flat stock 20 is based upon the thickness required for the sidewall members 12. Frames for prior art flat packs typically have had a sidewall member 12 thickness of about 0.040 inches or greater.

The use of flat stock in fabricating frames is particularly advantageous since flat stock may be readily processed to a variety of lengths 22 and widths 24 such that the fabrication options available by using flat stock are greater than that available with coining or extrusion operations. The use of flat stock permits raw materials inventory, and hence raw materials costs, to be significantly reduced.

For a predetermined fold-up frame 10 configuration, the flat stock 20 is cut to the predetermined width 24 which ensures that the fabricated fold-up frames 10 have the required perimeter, i.e., that the respective sidewall members 12 thereof have the required predetermined lengths 30. At least one major surface 21a of the flat stock 20 is then milled to form a plurality of lengthwise grooves 32 having angular faces 32a, as illustrated in FIGS. 2, 3A, 3B. As used herein, milling refers to any technique for removing strips of material from the surface of a piece of flat stock. The depth 34 of the grooves 32 is less than the overall thickness 26 of the flat stock 20. The included angle $\theta$ between respective faces 32a defining the grooves 32 is a predetermined variable that defines the number of sidewall members 12, and corresponding lengths 30 thereof, in the final assembled configuration of the fold-up frame 10. By way of example only, for a regular fold-up frame 10 having the octagonal configuration illustrated in FIG. 1B, the included angle $\theta$ would be about 45°. For the regular fold-up frame 10 shown in FIG. 1A, which has a hexagonal configuration, the included angle $\theta$ would be about 60°.

Figure 3C:
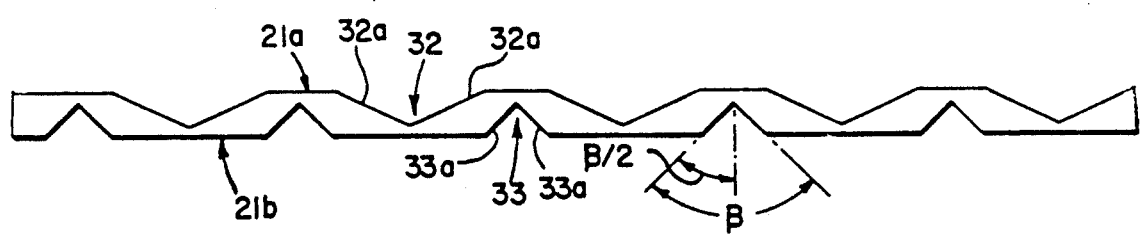
FIG. 3C is an end view illustrating flat stock processed to form a plurality of grooves in each major surface thereof.
Figure 3D:
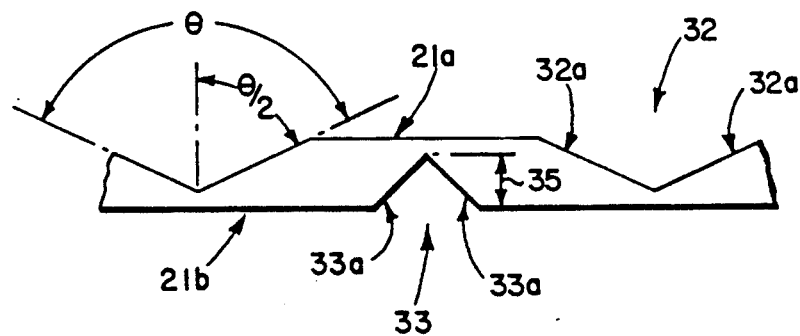
FIG. 3D is an enlarged partial view of FIG. 3C.

Depending upon the final assembly configuration of the fold-up frame 10 desired, the other major surface 21b of the flat stock 20 may be similarly milled to form a second plurality of lengthwise grooves 33 having angular faces 33a, as illustrated in FIGS. 3C, 3D. The depth 35 of the grooves 33 is less than the overall thickness 26 of the flat stock 20. The included angle $\beta$ between respective faces 33a defining the grooves 33 is a predetermined variable that defines, in combination with the included angle $\theta$ between respective faces 32a of the grooves 32 in the first major surface 21a, the number of sidewall members 12 in the final assembled configuration of the fold-up frame 10.

The pluralities of grooves 32, 33 permit the sidewalls 12 to be bent in different, opposed directions to form fold-up frames 10 having unusual geometric configurations. For example, the fold-up frame 10 having the star configuration as illustrated in FIG. 1C was fabricated by forming five grooves 32 having an included angle $\theta$ of 144° in the first major surface 21a and forming five grooves 33 having an included angle $\beta$ of 72° in the other major surface 21b.

As illustrated in the drawings the pluralities of grooves 32, 33 formed in the major surfaces 21a, 21b of the flat stock 20 are offset from one another. The grooves 32, 33 may be equidistantly offset from one another to form regular configurations (having bisymmetry) or the grooves 32, 33 may be unequally offset from one another to form irregular configurations.

The flat stock 20 exemplarily illustrated in FIG. 2 has been milled for fabrication of a fold-up frame 10 having an octagonal configuration. Eight full lengthwise grooves 32 have been milled in one surface of the flat stock 20 to define seven sidewall members 12 of predetermined length 30. The free ends 12A, 12B at the extreme widths of the flat stock 20 have been partially milled to form congruent angled faces 32p of one-half of the included angle $\theta$ of the full grooves 32. The free ends 12A, 12B including the congruent angled faces 32p have a length of about one-half of the predetermined length 30 of each complete sidewall member 12 defined between adjacent grooves 32.

Figure 4A:
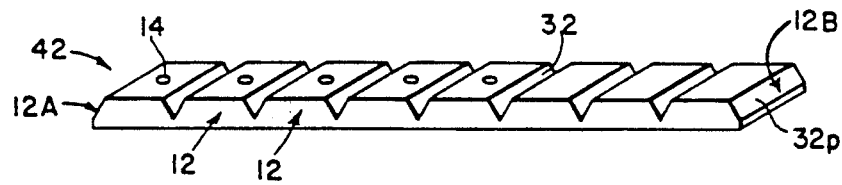
FIG. 4A is a perspective view illustrating the formation of apertures in individual milled frames.

At this juncture in the fabrication method, the milled flat stock 20 may then be sliced along predetermined slice lines, one exemplary slice line 40 being illustrated in FIG. 2, to form individual milled frames as indicated by reference numeral 42 (also see FIG. 4A). The slice lines 40 are defined so that each individual milled frame 42 has the predetermined height 28 required by the final configuration of the fold-up frame 20. The slicing operation is advantageous in that milled frames 42 may be formed to the required height 28 with well-defined edges. This eliminates the need for subsequent grinding of the frame as was typically required in the formation of frames by prior art methods.

The apertures 14 may now be formed, for example by piercing or punching, in each of the individual milled frames 42 as illustrated in FIG. 4A. For a better understanding of the invention, several of the sidewall members 12 are shown without apertures formed therethrough although it will be appreciated that all apertures in a frame 42 would be formed simultaneously. Because of the planar configuration of the individual milled frames 42, all of the apertures 14 for all of the sidewall members 12 of each fold-up frame 10 may be punched or pierced simultaneously in a single operation. The method of the present invention eliminates the multiple handling, multiple set-ups, and/or multiple tooling previously required to punch or pierce the apertures in prior art frames formed by coining or extrusion.

Figure 4B:
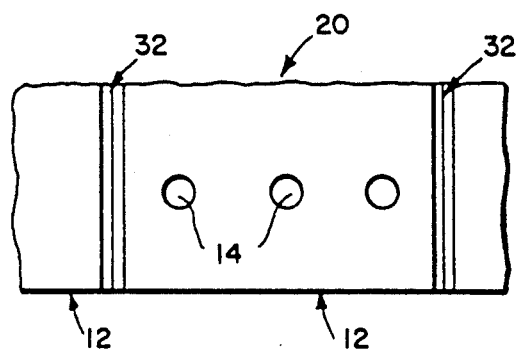
FIG. 4B is a partial plan view illustrating the formation of apertures in milled flat stock.

In an alternative method according to the present invention, the apertures 14 for each fold-up frame 10 may be formed in the milled flat stock 20 prior to the slicing thereof into individual milled frames, as exemplarily illustrated in FIG. 4B. Since the milled flat stock 20 also has a planar configuration, all of the apertures 14 for all of the sidewall members 12 of each fold-up frame 10 may be simultaneously formed in a single operation. Computer control techniques may be utilized to preposition the aperture forming apparatus (not shown) with respect to the milled flat stock 20 to ensure proper positioning of the apertures 14 in the respective sidewall members 12. In this alternative method, after the apertures have been formed, the milled flat stock 20 would then be sliced to form a plurality of apertured, individual milled frames 44.

Figure 5:
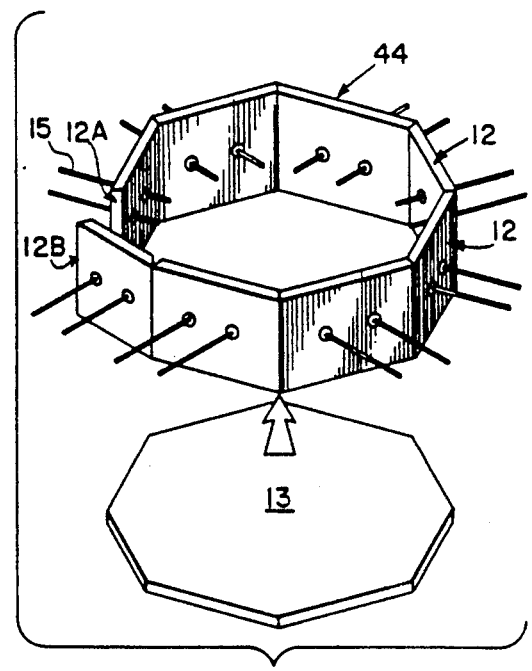
FIG. 5 is a perspective view illustrating the bending operation according to the present invention.

Each apertured, milled frame 44 is then folded or bent to bring the faces 32a defining each groove 32 into abutting engagement as exemplarily illustrated in FIG. 5. With respect to FIG. 2, this is accomplished by folding the milled frame along the respective grooves 32 out of the plane of the paper. This folding step causes the congruent angled faces 32p of the free ends 12A, 12B to be sequentially displaced through the several intended angles $\theta$ defined by the number of grooves 32 into abutting engagement with each other. A similar bending operation is effected for apertured, milled frames 44 having grooves 32, 33 formed in both major surfaces thereof.

The folding step thus transforms the apertured, milled frame 44 into the predetermined configuration of the fold-up frame 10. To fix the fold-up frame 10 in the predetermined configuration, the congruent angled faces 32p of the free ends 12A, 12B are secured together, for example by means of the braze joint 16 (see FIGS. 1A, 1B, 1C), to complete the fabrication of the fold-up frame 10. Optionally, the other abutting faces 32a of each groove 32 may be secured together, for example by brazing, to enhance the rigidity of the fabricated fold-up frame 10.

The insulative preforms 17 and conductive leads 15 may then be disposed in the fabricated fold-up frame 10. The assembled fold-up frame may then be mounted in carbon fixtures and heated to seal the beaded leads within the apertures 14 of the frame 10. Carbon sealing fixtures are universal in nature, thereby eliminating the high costs associated with specialized fixtures for prior art frame sealing. The use of carbon fixtures permits a substantial increase in the number of frames simultaneously being sealed, thereby reducing the per unit cost of frames formed by means of the present invention.

Figure 6:
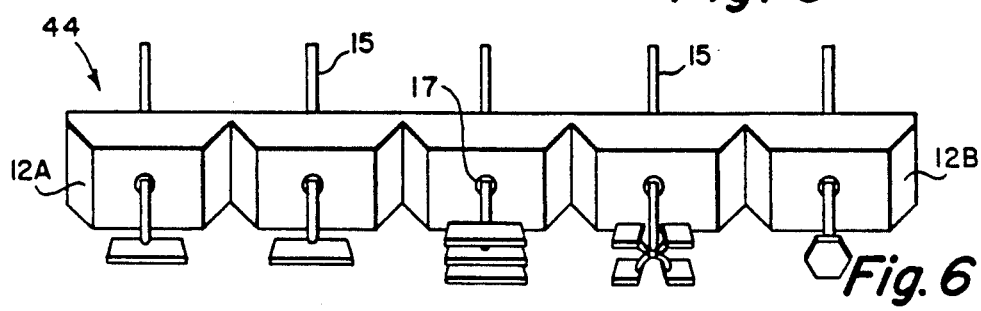
FIG. 6 is a perspective view showing the diverse variety of conductive leads that may be disposed in combination with the fold-up frame according to the present invention.

Alternatively, the insulative preforms 17 and the conductive leads 15 may be sealed in the individual apertured, milled frames 44 prior to the folding operation as exemplarily illustrated in FIG. 6. A wide variety of conductive leads may be disposed in combination with the fold up frame according to the present invention, a feature not possible utilizing conventional techniques for forming flat pack frames. The configuration of the fold-up frame formed according to the present invention permits accommodation of diverse conductive lead shapes, including oversized conductive tip leads since the package may be formed around the lead.

A variety of modifications and variations of the present invention are possible in light of the above teachings. It is therefore to be understood that within the scope of the appended claims, the present invention may be practiced otherwise than as specifically described hereinabove.

What is claimed is:

1. A method for fabricating fold-up frames having a predetermined configuration and having utility in forming flat packs for housing integrated circuit chips, comprising:
    providing a piece of metallic stock having predetermined dimensions of length, width and thickness for fabricating said fold-up frames having said predetermined configuration;
    milling at least one surface of said metallic stock lengthwise to form a plurality of grooves of predetermined angle therein, said plurality of grooves defining a plurality of sidewall members for said fold-up frames and a geometric shape of said predetermined configuration;
    processing said milled metallic stock to form apertures in each of said plurality of sidewall members defining a fold-up frame and slicing said milled metallic stock to form a plurality of individual milled frames having free ends, each of said plurality of individual milled frames having a predetermined height corresponding to said predetermined configuration height of said fold-up frames;
    folding each of said plurality of apertured, milled frames about each of said plurality of grooves thereof to form a folded frame having said free ends thereof disposed in abutting engagement in said predetermined configuration; and
    securing said free ends of said folded frame together to fix said told-up frame in said predetermined configuration.

2. The method of claim 1 wherein said processing step further comprises the sequential steps of:
    slicing said milled metallic stock to form a plurality of milled frames having free ends, each of said plurality of milled frames having said predetermined height defining said predetermined configuration height of said fold-up frame; and
    simultaneously forming apertures in said plurality of sidewall members of each of said plurality of individual milled frames.

3. The method of claim 1 wherein said processing step further comprises the sequential steps of:
    simultaneously forming apertures in said milled metallic stock in each of said plurality of sidewall members defining said predetermined configuration of a fold-up frame; and
    slicing said apertured, milled metallic stock to form a plurality of apertured, milled frames having free ends each of said plurality of apertured, milled frames having said predetermined height corresponding to said predetermined configuration height of said fold-up frames.

4. The method of claim 1 wherein said providing step comprises:
    cutting said metallic flat stock to said predetermined dimension of width, said predetermined dimension of width of said metallic stock defining a perimeter formed by said plurality of sidewall members of each of said fold-up frames.

5. The method of claim 1 wherein said providing step further comprises:
    cutting said metallic stock to said predetermined dimension of length, said predetermined length of said metallic flat stock, in combination with said predetermined configuration height of said fold-up frames, defining the number of said fold-up frames that can be fabricated from said metallic stock.

6. The method of claim 1 wherein said milling step further comprises:
    milling one major surface of said metallic stock lengthwise to form a plurality of grooves of predetermined angle in said one major surface; and
    milling the other major surface of said metallic stock lengthwise to form a plurality of grooves of predetermined angle in said other major surface.

7. The method of claim 6 wherein said plurality of grooves of predetermined angle milled in said one major surface of said metallic stock are offset from said plurality of grooves of predetermined angle milled in said other major surface of said metallic stock.

8. The method of claim 6 wherein said predetermined angle of said plurality of grooves milled in said one major surface of said metallic stock is unequal to said predetermined angle of said plurality of grooves milled in said other major surface of said metallic stock.

9. The method of claim 1 wherein said milling step further comprises:
    milling opposed edges defining said width of said metallic stock to form said free ends having congruent angled faces of about one-half of said predetermined angle.

10. The method of claim 1 further comprising the step of:
    inserting and sealing beaded conductive leads in said apertured, milled frames.

* * * * *